(12) United States Patent
Desai et al.

(10) Patent No.: US 6,266,249 B1
(45) Date of Patent: Jul. 24, 2001

(54) SEMICONDUCTOR FLIP CHIP BALL GRID ARRAY PACKAGE

(75) Inventors: Kishor V. Desai, Fremont; Sunil Patel, Los Altos; Ramaswamy Ranganathan, Saratoga, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/375,835

(22) Filed: Aug. 16, 1999

Related U.S. Application Data

(60) Provisional application No. 60/104,883, filed on Oct. 20, 1998.

(51) Int. Cl.$^7$ .................................................... H05K 1/18
(52) U.S. Cl. .................. 361/760; 361/748; 361/765; 361/767; 361/783; 361/807; 361/808; 257/736; 257/737; 257/738; 257/778; 257/780; 174/259; 174/260; 174/266
(58) Field of Search .................................... 361/760, 748, 361/762, 765, 767, 772, 783, 807, 808, 820; 174/250, 255, 258–260, 266; 257/734, 736–738, 698, 778, 780, 784

(56) References Cited

U.S. PATENT DOCUMENTS

| | | | |
|---|---|---|---|
| 5,535,101 | * 7/1996 | Miles et al. | 367/808 |
| 5,637,920 | 6/1997 | Loo . | |
| 5,854,534 | * 12/1998 | Beilin et al. | 257/691 |
| 6,015,955 | * 1/2000 | Farooq et al. | 174/260 |
| 6,037,044 | * 3/2000 | Giri et al. | 428/209 |
| 6,052,287 | * 4/2000 | Palmer et al. | 361/767 |
| 6,064,114 | * 5/2000 | Higgins, III | 257/698 |
| 6,097,089 | * 8/2000 | Gaku et al. | 257/712 |
| 6,097,609 | * 8/2000 | Kabadi | 361/760 |
| 6,162,997 | * 12/2000 | Memis | 174/260 |

* cited by examiner

*Primary Examiner*—Jeffrey Gaffin
*Assistant Examiner*—David Foster

(57) ABSTRACT

A semiconductor package is present along with an associated method. The package comprises a substrate with a top surface and a bottom surface, the substrate having a plurality of electrically conductive vias extending from the top surface of the substrate to the bottom surface of the substrate. A semiconductor device having an active surface, the active surface having a plurality of bonding pads, is attached to the substrate by an adhesive that bas holes that align with the vias. The vias are also aligned with the bonding pads. Solder serves to electrically and mechanically couple each of the bonding pads with a corresponding via. Each of the vias, in turn, is coupled to a solder ball formed on the bottom of the substrate.

21 Claims, 2 Drawing Sheets

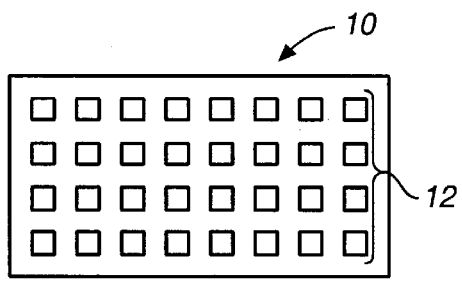
FIG._1
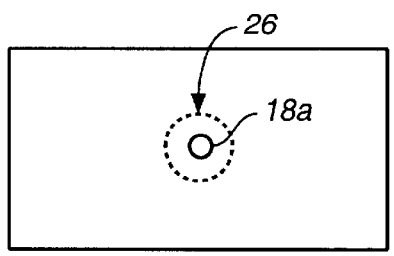
FIG._2d
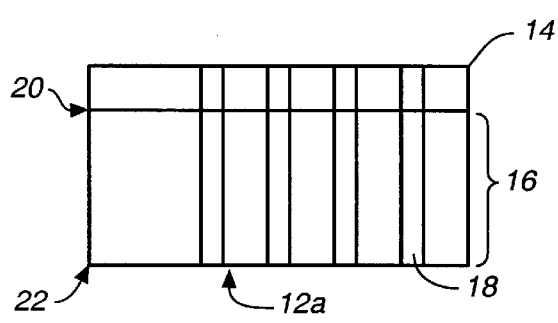
FIG._2a
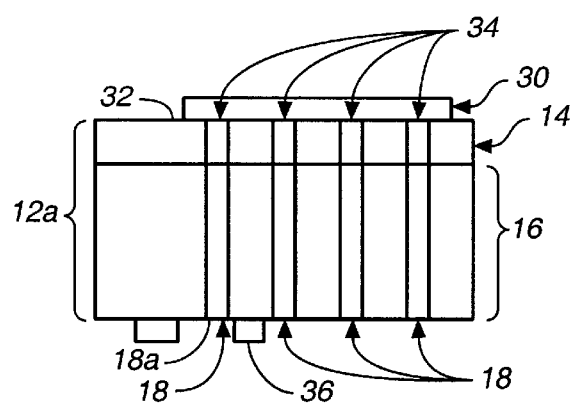
FIG._3a
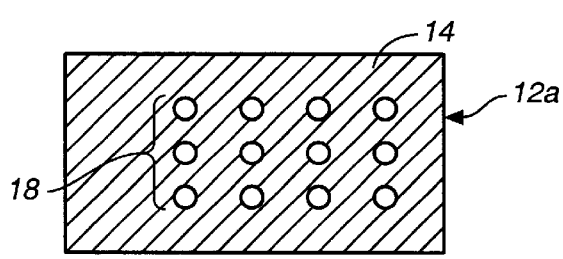
FIG._2b
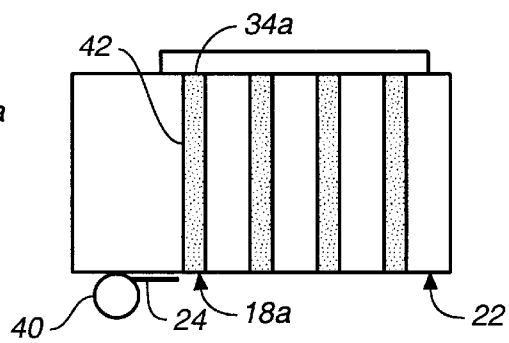
FIG._3b
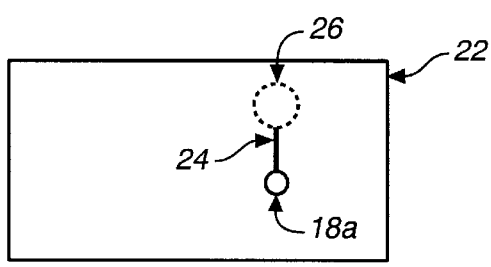
FIG._2c

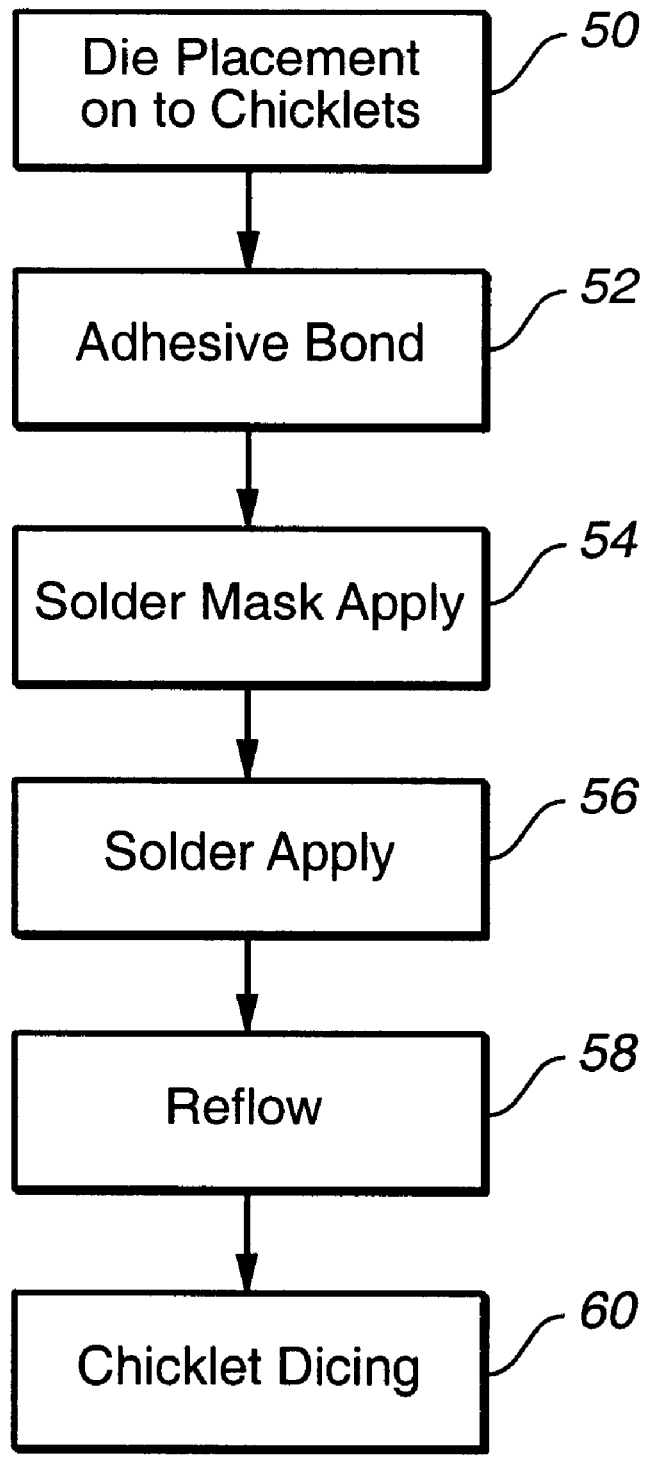
FIG._4

SEMICONDUCTOR FLIP CHIP BALL GRID ARRAY PACKAGE

This application claims benefit of Provisional 60/104,883 filed Oct. 20, 1998.

BACKGROUND OF THE INVENTION

1. Field of the Invention

This invention relates to the packaging of semiconductor devices, and in particular to a chip scale flip chip package and a method for creating a chip scale flip chip package.

2. Description of the Related Art

The use of semiconductor devices, integrated circuits in particular, in portable electronic devices such as digital cell phones has grown strongly in recent years and that growth is projected to continue well into the foreseeable future. For such portable devices, it is highly desirable to have a packaged integrated circuit that is as small as possible so that the size of such devices may be commensurately decreased and/or to allow more components to be integrated within such devices. Indeed, the demand for chip scale packages, which are packages that have a cross sectional area that is not significantly larger than the cross sectional area of an integrated circuit, is expected to grow significantly over the next few years. The smaller size packages, however, must accommodate ever increasing lead counts for integrated circuits without sacrificing the packages' protective functions.

To meet the need for ever shrinking package sizes and ever growing lead counts, flip chip and ball grid array (BGA) technologies have become increasingly popular. Flip chip relates to the attachment of an integrated circuit to a substrate while BGA relates to the attachment of a substrate to a printed circuit board or the like. Flip chip BGA packages (FCBGA), which combine the two technologies, are relatively small and have relatively high lead counts.

According to one conventional method for creating FCBGA packages, solder bumps are affixed to an integrated circuit, the integrated circuit is attached to one side of a substrate, underfill is then dispensed between gaps between the integrated circuit and the substrate and then cured, and solder balls are then attached to the other side of the substrate. The first step, affixing ball-shaped beads or bumps of solder to the integrated circuit's bonding pads, is typically performed before a wafer is diced into individual die and therefore before individual die are tested. Thus, for those die that turn out to be defective, the step of affixing the solder balls to that die has been wasted. It would be desirable to avoid spending time providing packaging for defective die.

After the solder balls have been affixed, the die is then "flipped" such that the solder bumps are brought into contact with corresponding conductive traces on a packaging substrate. The solder balls are then reflowed to connect the integrated circuit to the substrate. The first steps, affixing solder balls, "flipping" and then reflowing, as described above, are relatively time consuming. Further, relatively expensive machinery is required to perform these steps.

The next step, dispensing and curing underfill, is also relatively complex and time consuming. An underfill materially, typically a thermo-set epoxy, is dispensed in the gap between an integrated circuit and a substrate. The epoxy is then cured by heating the substrate and integrated circuit to an appropriate curing temperature. The assembly is then cooled down. The heating and cooling steps take a relatively long time to perform and also subject the integrated circuit to the stresses and strains associated with changing the temperature of a material.

It is desirable to improve upon conventional methods for assembling FCBGA packages. In particular, it is desirable to reduce the time required to assemble a FCBGA and to reduce the need for relatively expensive equipment required by certain conventional FCBGA packaging methods.

SUMMARY OF THE INVENTION

These and other needs are met by a package for mounting a semiconductor device to a circuit board according to the present invention. In a preferred embodiment, the package comprises a substrate with a top surface and a bottom surface, the substrate having a plurality of electrically conductive vias extending from the top surface of the substrate to the bottom surface of the substrate. A semiconductor device, having an active surface, the active surface having a plurality of bonding pads, is attached to the substrate by an adhesive that has holes that align with the vias. The vias are also aligned with the bonding pads. Solder serves to electrically couple each of the bonding pads with a corresponding via Each of the vias, in turn, is coupled to a solder ball formed on the bottom of the substrate.

In the preferred embodiment, the package described above is created according to the following method. An interposer panel comprising a plurality of chicklets is created, each of the chicklets comprising a substrate and adhesive as described above. Each of a plurality of integrated circuits is placed on the top surface of one of the chicklets. The adhesive is then cured. A solder mask is applied to the bottom surface of each of the plurality of chicklets and solder is then applied to each of the solder masks. The solder is then reflowed, which simultaneously results in the electrical coupling of bonding pads of the plurality of integrated circuits with the vias and the formation of solder balls on the bottom surface of each of the plurality of chicklets. Finally, the interposer panel is diced to create individual packaged integrated circuits.

BRIEF DESCRIPTION OF THE DRAWINGS

Other objects and advantages of the invention will become apparent upon reading the following detailed description and upon reference to the accompanying drawings in which:

FIG. 1 illustrates an interposer panel that includes a plurality of chicklets.

FIG. 2a is a cross sectional view of one of the chicklets illustrated in FIG. 1.

FIG. 2b illustrates a top side of the chicklet illustrated in FIG. 2a.

FIG. 2c illustrates the bottom side of the chicklet illustrated in FIG. 2a.

FIG. 2d illustrates an alternative embodiment of the bottom side of the chicklet illustrated in FIG. 2a.

FIG. 3a is a cross sectional view of the chicklet illustrated in FIG. 2a mechanically coupled to an integrated circuit.

FIG. 3b is a cross sectional view of the chicklet and integrated circuit illustrated in FIG. 3a after solder reflow.

FIG. 4 is a flow chart that summarizes the preferred embodiment of the method for creating the package illustrated in FIG. 3b.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1 illustrates an interposer panel 10, comprising a printed circuit board material, that includes a plurality of chicklets 12. As will be further described below, each of a plurality of semiconductor devices, typically integrated circuits, is attached to a top surface of a corresponding one of the plurality of chicklets 12. As will be further described below, a BGA will be formed on a bottom surface of each of the plurality of chicklets 12.

FIG. 2a is a cross sectional view of one of the chicklets 12, which will be referred to as chicklet 12a. As shown, the chicklet 12a comprises a substrate 16 with an adhesive 14 attached to a top surface 20 of the substrate 16. A plurality of electrically conductive vias 18 extend from the top surface 20 of the substrate 16 to a bottom surface 22 of the substrate 16 and therefore form openings on the bottom surface 22 of the substrate 16. The adhesive 14 has a plurality of holes that are aligned with the vias 18. That part each of the vias 18 within the substrate 16 is plated with a conductive substance, preferably copper. As will be further described below, solder will at least partially fill each of the vias 18 to electrically couple each of the vias 18 to a corresponding bonding pad on an integrated circuit. FIG. 2b illustrates a top side of the chicklet 12a. As shown, the plurality of vias 18 are arranged in rows and columns but it will be appreciated that the plurality of vias 18 may be arranged in any number of ways. As previously described, each of the plurality of vias 18 extends through the adhesive 18.

FIG. 2c illustrates the bottom side of the chicklet 12a which is also the bottom surface 22 of the substrate 16. For purposes of illustration, only one of the plurality of vias 18 is shown, which will be referred to as via 18a. A conductive trace 24, preferably copper, is patterned on the bottom surface 22 to electrically couple the via 18a with a solder ball that will be placed in a location shown as a dashed line 26. It will be appreciated that solder balls may be arranged in any manner. In an alternate embodiment, as shown in FIG. 2d conductive traces may be omitted and a solder ball may be placed directly over the via 18a.

FIGS. 3a and 3b illustrate the steps of forming solder balls on the substrate 16 at the bonding site and electrically coupling bonding pads on an integrated circuit to the plurality of vias 18. FIG. 3a is a cross sectional view of the chicklet 12a mechanically coupled to a semiconductor device 30, which is typically an integrated circuit, and a solder mask 36, which is placed on the bottom surface 22 of the substrate 16. The semiconductor device 30 has an active surface 32 that includes a plurality of bonding pads 34, each of which is aligned with a corresponding one of the plurality of vias 18. The active surface 32 is mechanically coupled to the adhesive 14, as will be more fully described below. Solder is applied to the solder mask 36 and into each of the plurality of vias 18. The solder is then reflowed.

The result of the reflowing is illustrated in FIG. 3b. As shown, solder 42 fills the via 18a and a solder ball 40 is mechanically coupled to the bottom surface 22 of the substrate 16. The solder 42 electrically couples one of the plurality of bonding pads 34, which will hereinafter be referred to as bonding pad 34a, to the via 18a, which in turn is electrically coupled to the solder ball 40 via the conductive trace 24. Thus, a conductive path exists between the bonding pad 34a and the solder ball 40. For purposes of illustration, FIG. 3b shows only the solder ball 40 but in actuality there is one solder ball for each one of the plurality of bonding pads 34.

FIG. 4 is a flow chart that summarizes the preferred embodiment of the packaging method described above. Step 50 comprises simultaneously placing each of a plurality of integrated circuits on the adhesive top surface of a corresponding one of the plurality of chicklets 12. In step 52, the adhesive is cured. In step 54, a solder mask is applied to the bottom surface of each of the plurality of chicklets 12 and in step 56, solder is applied to each of the solder masks. In step 58, the solder is reflowed, which, as previously described, simultaneously results in the electrical coupling of bonding pads of the plurality of integrated circuits with vias and the formation of solder balls on the bottom surface of each of the plurality of chicklets 12. Finally, in step 60, the plurality of chicklets 12 are diced to create individual packaged integrated circuits is diced to detach from one another. The exposed surface of each integrated circuit may be coated with a protective layer either before or after dicing.

Numerous variations and modifications will become apparent to those skilled in the art once the above disclosure is fully appreciated. It is intended that the following claims be interpreted to embrace all such variations and modifications.

What is claimed is:

1. A package for mounting a semiconductor device to a circuit board, comprising:

a substrate with a top surface and a bottom surface, the substrate having a plurality of electrically conductive vias extending from the top surface of the substrate to the bottom surface of the substrate;

a semiconductor device having an active surface, the active surface having a plurality of bonding pads;

an adhesive with a top surface and a bottom surface, the adhesive having a plurality of holes extending from the top surface of the adhesive to the bottom surface of the adhesive, the adhesive disposed between the substrate and the semiconductor device such that the plurality of holes in the adhesive are at least partially aligned with the plurality of vias in the substrate and at least partially aligned with the plurality of bonding pads on the active surface of the semiconductor device;

a plurality of external electrical contacts proximate to the bottom surface of the substrate, each of the plurality of external electrical contacts being electrically coupled to a corresponding one of the plurality of vias; and wherein
each of the plurality of bonding pads is electrically coupled to a corresponding one of the plurality of vias.

2. The package as recited in claim 1, wherein at least part of the top surface of the adhesive is in contact with the active surface of the semiconductor device and at least part of the bottom surface of the adhesive is in contact with the top surface of the substrate.

3. The package as recited in claim 1, wherein solder electrically couples at least one of the plurality of bonding pads to corresponding one of the plurality of vias.

4. The package as recited in claim 2 wherein solder fills the corresponding one of the plurality of vias.

5. The package as recited in claim 1 at least one of the plurality of external electrical contacts comprises a solder ball formed on the bottom surface of the substrate.

6. The package as recited in claim 5 wherein the solder ball is adjacent to one of the plurality of vias and electrically coupled to the one of the plurality of vias.

7. The package as recited in claim 5 wherein the solder ball is substantially completely aligned with one of the plurality of vias and electrically coupled to the one of the plurality of vias.

8. The package as recited in claim 1 wherein the plurality of holes in the adhesive are substantially completely aligned with the plurality of vias in the substrate.

9. The package as recited in claim 1 wherein the plurality of holes in the adhesive are substantially completely aligned with the plurality of bonding pads on the active surface of the semiconductor device.

10. A method for manufacturing a package for mounting a semiconductor device to a circuit board, the method comprising the steps of:

providing a substrate with a top surface and a bottom surface, the substrate having a plurality of electrically conductive vias extending from the top surface of the substrate to the bottom surface of the substrate;

providing a semiconductor device having an active surface, the active surface having a plurality of bonding pads;

attaching the top surface of the substrate to the active surface of the semiconductor device such that the plurality of vias in the substrate are at least partially aligned with the plurality of bonding pads on the active surface of the semiconductor device, the step of attaching occurring before at least one of the bonding pads is electrically coupled to a corresponding one of the plurality of vias;

electrically coupling a plurality of external electrical contacts proximate to the bottom surface of the substrate to a corresponding one of the plurality of bonding pads.

11. The method as recited in claim 10, wherein the step of attaching comprises the step of disposing an adhesive between the semiconductor device and the substrate.

12. The method as recited in claim 11 wherein the adhesive has a top surface and a bottom surface and the step of disposing an adhesive is performed such that at least part of the top surface of the adhesive is in contact with the active surface of the semiconductor device and at least part of the bottom surface of the adhesive is in contact with the top surface of the substrate.

13. The method as recited in claim 12 wherein the adhesive has a plurality of holes and the step of disposing an adhesive is performed such that the plurality of holes in the adhesive are substantially completely aligned with the plurality of vias in the substrate.

14. The method as recited in claim 13 wherein the plurality of holes in the adhesive are substantially completely aligned with the plurality of bonding pads on the active surface of the semiconductor device.

15. The method as recited in claim 10, wherein the step of electrically coupling a plurality of external electrical contacts comprises the steps of:

disposing a solder mask on the bottom surface of the substrate;

providing solder to the solder mask, at least part of the solder entering each of the plurality of vias; and reflowing the solder such that each bonding bad is electrically coupled by the solder to a corresponding one of the plurality of vias.

16. The method as recited in claim 10, wherein at least one of the external electrical contacts comprises a solder ball.

17. The method as recited in claim 16 wherein the at least one solder ball is adjacent to one of the plurality of vias and electrically coupled to the one of the plurality of vias.

18. The method as recited in claim 16 wherein the at least one solder ball is substantially completely aligned with one of the plurality of vias and electrically coupled to the one of the plurality of vias.

19. A method for manufacturing a package for mounting a semiconductor device to a circuit board, the method comprising the steps of:

dicing a wafer into a plurality of die;

providing at least two substrates;

substantially simultaneously attaching each of at least two of the plurality of die to a corresponding one of the at least two substrates.

20. A method for manufacturing a package for mounting a semiconductor device to a circuit board, the method comprising the steps of:

providing a substrate with a top surface and a bottom surface;

providing a semiconductor device having an active surface, the active surface having a plurality of bonding pads;

attaching the top surface of the substrate to the active surface of the semiconductor device;

electrically coupling at least one of the plurality of bonding pads to the substrate;

forming at least one solder ball proximate to the bottom surface of the substrate to a corresponding one of the plurality of bonding pads; and wherein the preceding two steps occur substantially simultaneously.

21. A method for manufacturing a package for mounting a semiconductor device to a circuit board, the method comprising the steps of:

providing a substrate with a top surface and a bottom surface, the substrate having a plurality of electrically conductive vias extending from the top surface of the substrate to the bottom surface of the substrate, each of the plurality of forming an opening on the bottom surface of the substrate;

providing a semiconductor device having an active surface, the active surface having a plurality of bonding pads;

attaching the top surface of the substrate to the active surface of the semiconductor device such that the plurality of vias in the substrate are at least partially aligned with the plurality of bonding pads on the active surface of the semiconductor device;

dispensing solder through each of the openings on the bottom surface of the substrate to electrically couple each of the plurality of bonding pads with a corresponding one of the plurality of vias.

* * * * *